(12) United States Patent
Guerra et al.

(10) Patent No.: US 7,573,107 B2
(45) Date of Patent: Aug. 11, 2009

(54) POWER MODULE

(75) Inventors: Alberto Guerra, Palos Verdes Estates, CA (US); Norman G. Connah, Glossop (GB); Mark Steers, Tilgate Crawley (GB); George Pearson, Crawley Down (GB)

(73) Assignee: International Rectifier Corporation, El Segundo, CA (US)

( * ) Notice: Subject to any disclaimer, the term of this patent is extended or adjusted under 35 U.S.C. 154(b) by 278 days.

(21) Appl. No.: 11/234,763

(22) Filed: Sep. 23, 2005

(65) Prior Publication Data

US 2006/0071238 A1  Apr. 6, 2006

Related U.S. Application Data

(60) Provisional application No. 60/612,314, filed on Sep. 23, 2004.

(51) Int. Cl.
*H01L 27/088* (2006.01)

(52) U.S. Cl. .............. 257/401; 257/150; 257/177; 257/691; 257/723; 257/E23.169

(58) Field of Classification Search .......... None
See application file for complete search history.

(56) References Cited

U.S. PATENT DOCUMENTS

| | | | |
|---|---|---|---|
| 6,329,714 B1* | 12/2001 | Guillot | 257/723 |
| 6,423,623 B1* | 7/2002 | Bencuya et al. | 438/612 |
| 6,740,969 B1* | 5/2004 | Hirashima | 257/723 |
| 2003/0057530 A1* | 3/2003 | Karrer | 257/666 |
| 2003/0168252 A1* | 9/2003 | Schmid et al. | 174/260 |
| 2004/0232538 A1* | 11/2004 | Linke | 257/686 |
| 2004/0256710 A1* | 12/2004 | Schwarzbauer et al. | 257/690 |
| 2005/0024838 A1* | 2/2005 | Maxwell | 361/782 |

FOREIGN PATENT DOCUMENTS

WO  WO 03032390 A2 *  4/2003

OTHER PUBLICATIONS

Patent Assignment Abstract of Title for U.S. Patent Publication No. 20040232538, published Nov. 25, 2004.

* cited by examiner

*Primary Examiner*—Sue Purvis
*Assistant Examiner*—Leslie Pilar Cruz
(74) *Attorney, Agent, or Firm*—Farjami & Farjami LLP

(57) ABSTRACT

A power module that includes a power circuit assembly in which power components are electrically and mechanically connected without wires.

3 Claims, 13 Drawing Sheets ered.

POWER MODULE

RELATED APPLICATION

This application is based on and claims benefit of U.S. Provisional Application No. 60/612,314, filed on Sep. 23, 2004, entitled MODULE USING INTEGRATED SINGLE BOARD (ISB) TECHNOLOGY, to which a claim of priority is hereby made and the disclosure of which is incorporated by reference.

BACKGROUND OF THE INVENTION

The present invention relates to power modules.

A typical power module includes a plurality of power semiconductor device interconnected to form a power circuit. Wirebonding is a well known method to obtain the physical interconnection between the power semiconductor devices of a power circuit.

Wirebonding, while convenient, is disadvantageous as it introduces additional resistance and inductance, which adversely affect the performance of the power module.

It is, therefore, desirable to eliminate wirebonding as a means of interconnection in order to improve the performance of the power module.

SUMMARY OF THE INVENTION

It is an object of the present invention to provide a power module having a power circuit assembly in which the power semiconductor devices are interconnected without using wirebonds, i.e. wire-free-connected.

A power module according to the present invention includes a power circuit assembly that includes a thermally conductive substrate having a plurality of conductive pads disposed thereon, a first power circuit that includes a first power semiconductor die having a first power electrode electrically and mechanically connected to a respective conductive pad on the substrate by a conductive adhesive and a second power electrode disposed opposite the first power electrode, a second power semiconductor die having a first power electrode electrically and mechanically connected to another conductive pad on the substrate by a conductive adhesive, and a conductive clip electrically and mechanically connected to the second power electrode of the first power semiconductor die by a conductive adhesive and the another conductive pad, whereby the power semiconductor die are electrically connected wire-free.

Another advantage of the present invention is that the power circuit assembly can be joined in a single operation. Specifically, for example, all the power circuit assembly elements are joined together in a single solder reflow step, rather than assembled through several steps, as would be the case when wirebonds are used as a means of connection.

Other features and advantages of the present invention will become apparent from the following description of the invention which refers to the accompanying drawings.

DETAILED DESCRIPTION OF THE EMBODIMENTS

Figure 1:
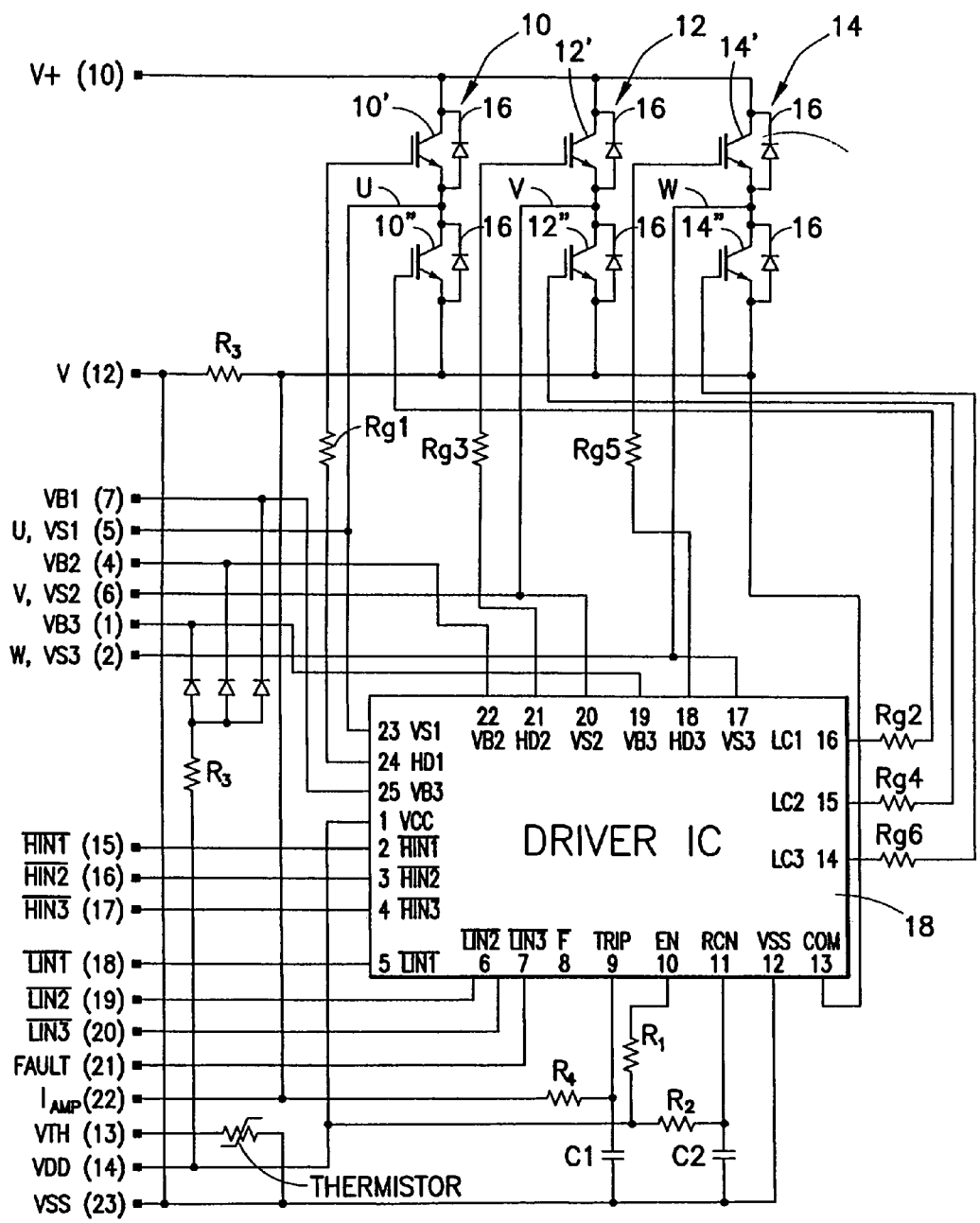
FIG. 1 shows a circuit diagram implemented in a power module according to an embodiment of the present invention.

Referring first to FIG. 1, a power module according to an embodiment of the present invention includes a power circuit. The power circuit in the preferred embodiment of the present invention includes three parallel-connected half-bridge circuits 10, 12, 14 each for providing power to a respective phase of a three phase motor. Each half-bridge circuit 10, 12, 14 includes a high side semiconductor power switch 10', 12' 14', and a low side semiconductor power switch 10", 12", 14", each having preferably a respective free wheeling diode 16 parallel-connected across its power poles as is well known in the art.

Each semiconductor power switch may be a power MOSFET, an IGBT, a III-nitride based power FET (e.g. a GaN based power switch) or the like. In the preferred embodiment, semiconductor power switches 10', 10", 12', 12", 14', 14" are IGBTs. As seen in FIG. 1, and known in the art, each high side IGBT 10', 12', 14' is series connected at the emitter side thereof to the collector side of a respective low side IGBT 10", 12", 14". Also, as is well known, the phase output U, V, W of each half-bridge 10, 12, 14 is taken from the node connection of a high side 10', 12', 14' to a respective low side IGBT 10", 12", 14". In the preferred embodiment, driver IC 18 is operatively connected to the gate electrodes of IGBTs 10', 10", 12', 12", 14', 14", whereby the gate electrode of each IGBT can be driven to operate the IGBT as is well known.

Figure 2:
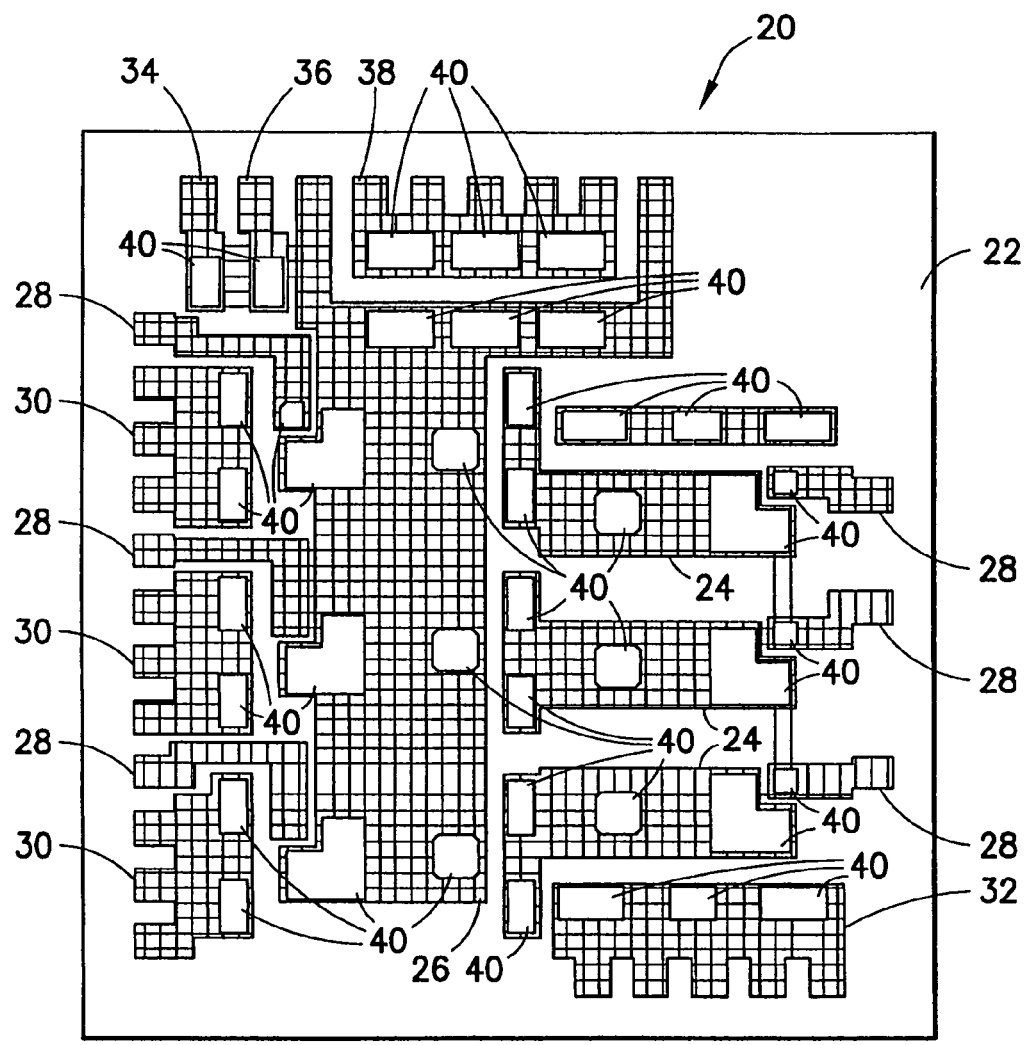
FIG. 2 shows a top plan view of a substrate in a power module according to the present invention.

A power module according to the present invention includes a power circuit assembly. Referring to FIG. 2, the power circuit assembly includes thermally conductive substrate 20. Substrate 20 includes a thermally conductive body 22 having a plurality of conductive pads formed on one surface thereof. The conductive pads of substrate 20 are intended to receive at least IGBTs 10', 10", 12', 12", 14', 14", and optionally passive elements such as shunt resistors, a thermistor, or the like. Specifically, substrate 20 includes conductive pads 24 for receiving high side IGBTs 10', 12', 14', and preferably one conductive pad 26 for receiving low side IGBTs 10", 12", 14". Furthermore, conductive pads 28 are provided as a means of connection to the gate electrode of each IGBT (whereby wirebonding to the gate electrode is also eliminated), phase pads 30 are provided each as a means of connection to the output of a respective half-bridge 10, 12, 14 (FIG. 1), and at least one voltage input pad 32 is provided for external connection to the bus. Note that conductive pad 26 is connectable to the ground. Optionally, substrate 20 may include a pair of pads 34, 36 to receive a thermistor, and another conductive pad 38 for receiving one pole of a shunt resistor, or preferably a plurality of shunt resistors. The conductive pads of substrate 20 are preferably made from copper, and body 22 may be made from a thermally conductive ceramic such as $Al_2O_3$. Substrate 20 thus may be an insulated metal substrate (IMS), or a direct bonded copper (DBC) substrate.

It should be noted that each conductive pad is provided at least with one solder pad 40. Each solder pad 40 on pads 28 is designated for solder connection to a respective gate electrode, and solder pads 40 on pad 26 and pads 24 are designated for solder connection to the emitter electrodes of IGBTs 10', 10", 12', 12", 14', 14", cathode electrodes of free wheeling diodes 16, as well as conductive clips used for interconnection of the elements of the power circuit assembly as will be described below.

Figure 3:
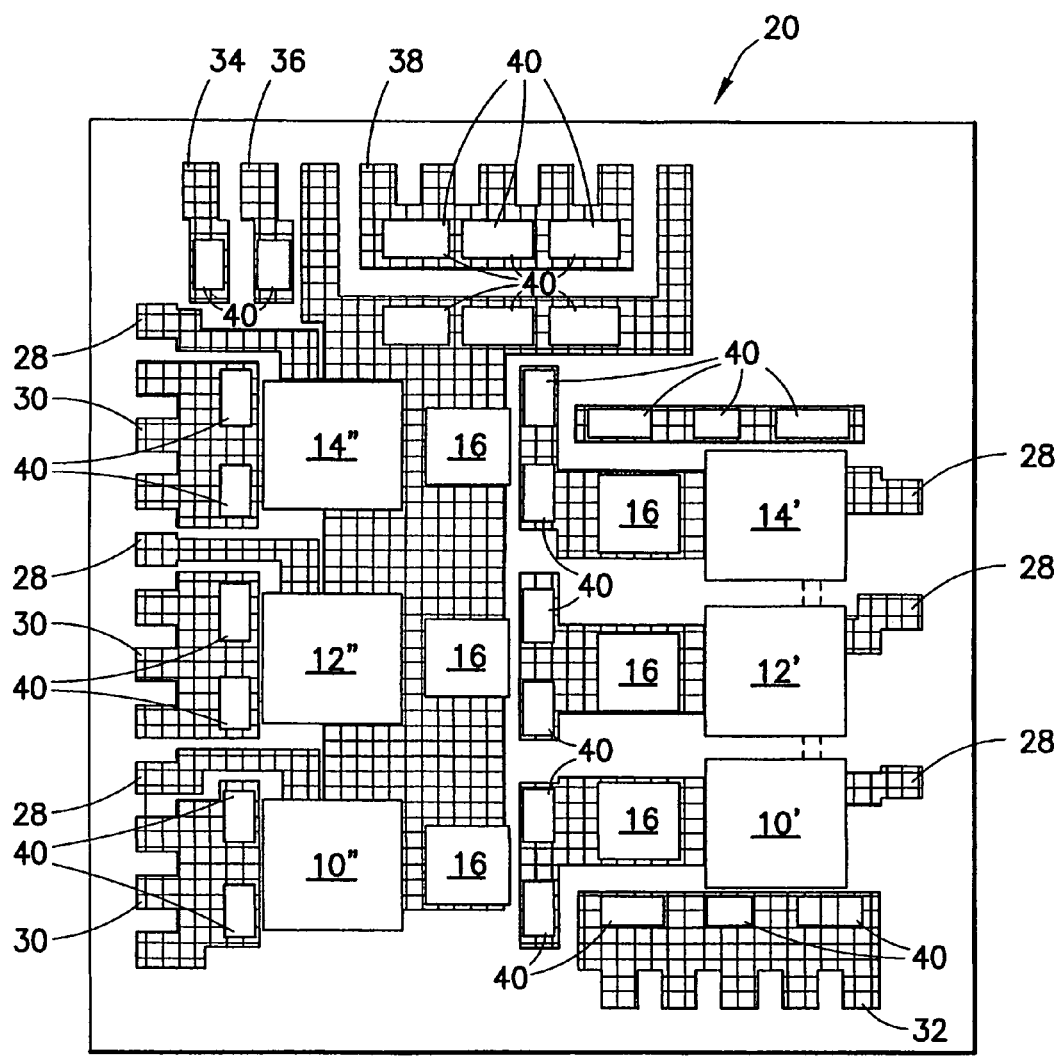
FIG. 3 shows a top plan view of the substrate of FIG. 2 having power semiconductor die arranged thereon.

Referring next to FIG. 3, each IGBT 10', 10", 12', 12", 14', 14" is electrically and mechanically connected by a layer of conductive adhesive such as solder or conductive epoxy, emitter side down, to a respective solder pad of a conductive pad of substrate 20, and each free-wheeling diode 16 is electrically and mechanically connected, cathode side down, in the same manner to a respective solder pad 40 of a conductive pad.

Figure 4:
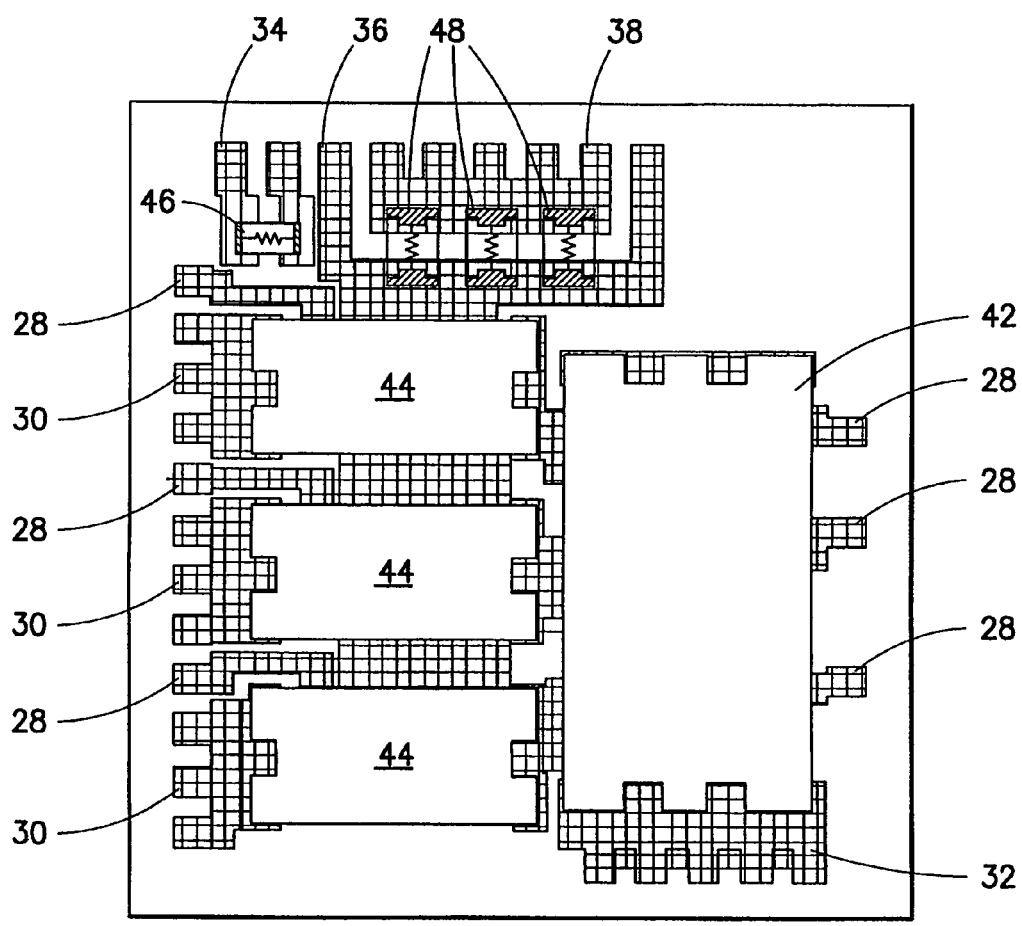
FIG. 4 shows a top plan view of the arrangement of FIG. 3 having conductive clips arranged on the die to realize a power circuit assembly according to the first embodiment of the present invention.

Referring next to FIG. 4, in one embodiment of the present invention, a conductive clip 42 is electrically and mechanically connected by a conductive adhesive such as solder or conductive epoxy to the collector electrodes of high side IGBTs 10', 12', 14', and their associated free wheeling diodes 16. In addition, conductive clip 42 is electrically connected by a conductive adhesive such as solder, conductive epoxy, or the like, to pad 32. In addition, a conductive clip 44 is electrically and mechanically connected by a conductive adhesive such as solder, a conductive epoxy or the like, to the collector electrode of a respective low side IGBT 10", 12", 14" and its associated free-wheeling diode 16. Conductive clip 42, and clip 44 may be made from any electrically conductive body such as a copper strap.

Figure 5:
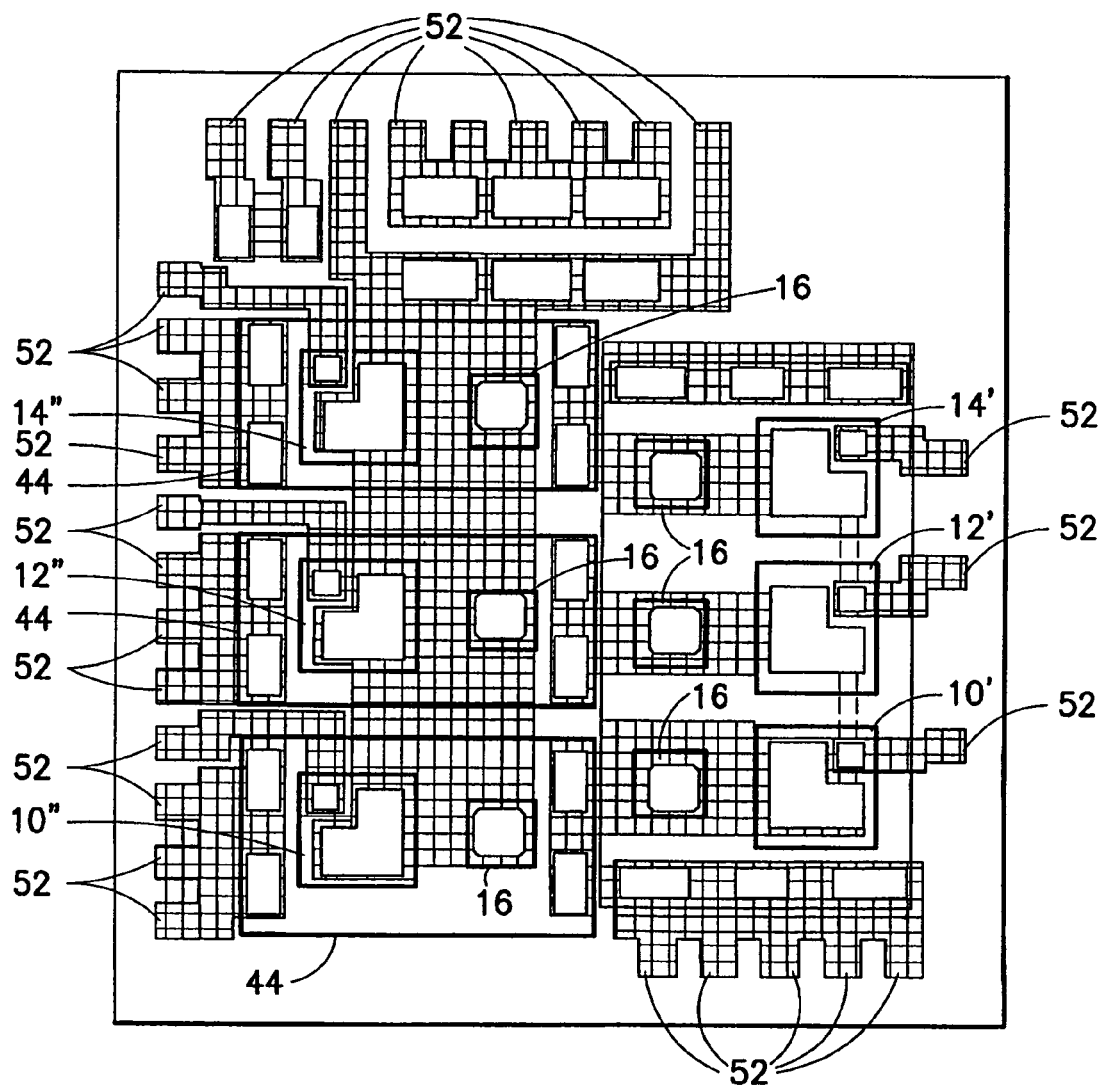
FIG. 5 shows the power circuit assembly of FIG. 4 in which the conductive clips and the semiconductor die are rendered transparent leaving only the outline thereof illustrated.

According to one aspect of the present invention, each conductive clip 44 is electrically and mechanically connected by a conductive adhesive such as solder, conductive epoxy, or the like, to a respective conductive pad 24 at one side thereof, to form a half-bridge with a high side IGBT wire-free (without wirebonds), and to a pad 30 at another side thereof, whereby a phase output connection can be provided from the half bridge so formed through pad 30 wire-free. Optionally, a thermistor 46 can be electrically and mechanically connected to pads 34, 36, and a plurality of resistors 48 can be connected to pads 38 and 26 as illustrated in FIG. 4. FIG. 5 has rendered IGBTs 10', 10", 12', 12", 14', 14", diodes 16, and clips 42, 44 transparent leaving only an outline thereof to better illustrate the arrangement of the elements in a power circuit assembly according to the present invention.

Figure 6A:
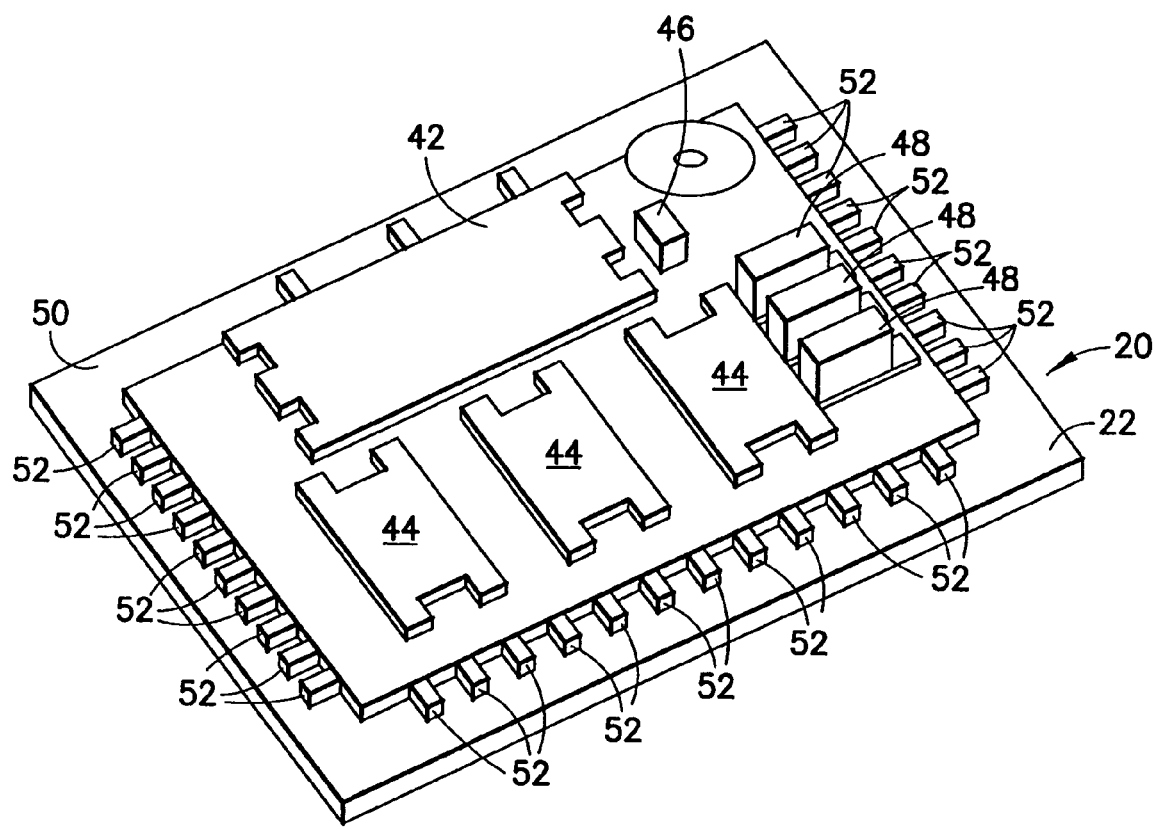
FIG. 6A shows a perspective view of a power circuit assembly according to the first embodiment of the present invention.
Figure 6B:
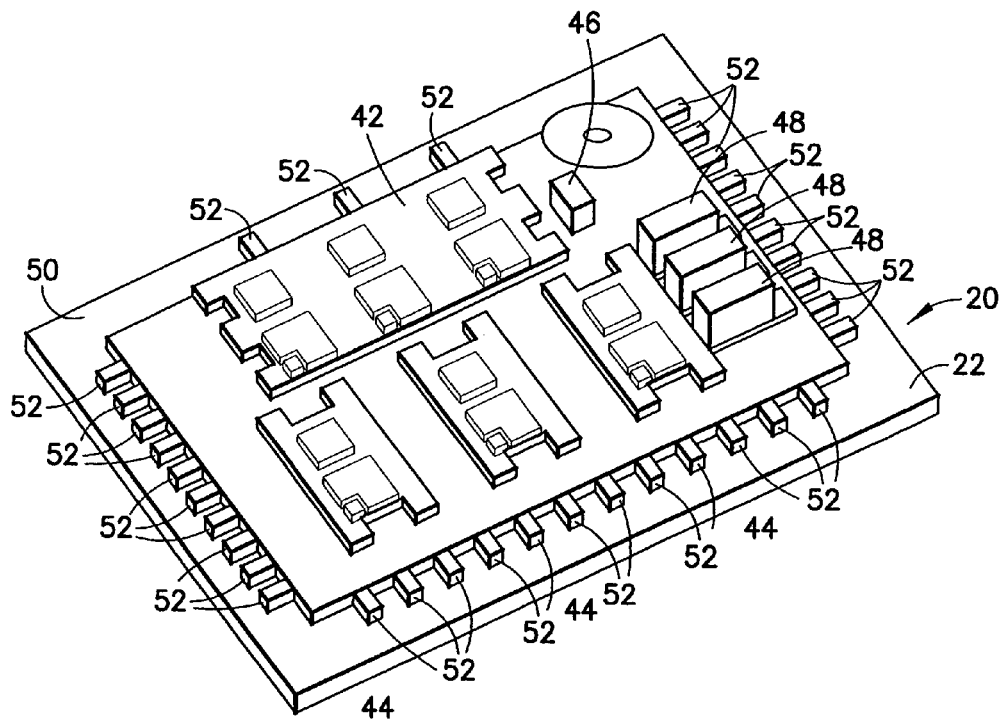
FIG. 6B shows the power circuit assembly of FIG. 6A having the clips and the semiconductor die rendered transparent for illustration purposes.

Referring next to FIG. 6A, a power circuit assembly according to the preferred embodiment may further include a passivation body 50 which covers exposed portions of the conductive pads of substrate 20, and also underfills open spaces between clip 42, clips 44 and substrate 20, but does not cover connector portions of the conductive pads. Specifically, each conductive pad of substrate 20 may include at least one connector portion 52 which remains exposed (not covered by passivation 50) and is intended preferably for direct external connection to a corresponding pad by a conductive adhesive. Preferably, connector portions 52 are arranged along edges of substrate body 22.

Figure 6C:
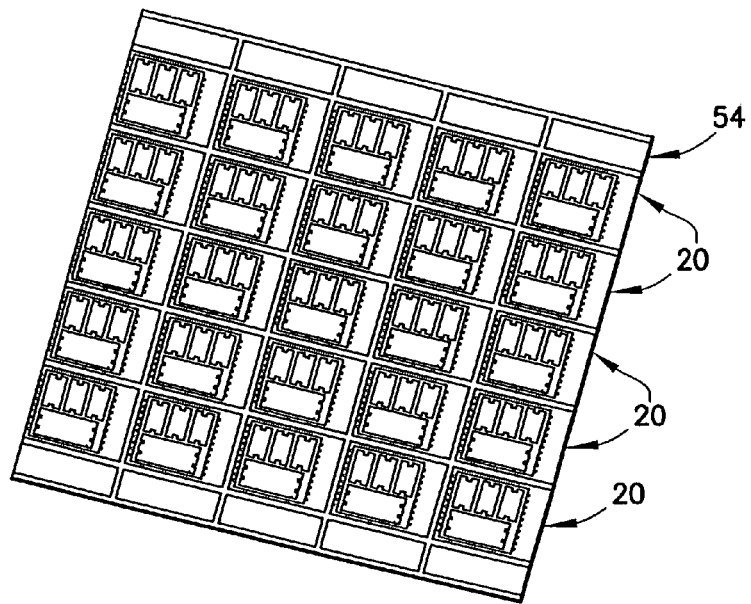
FIG. 6C shows a plurality of power circuit assemblies in a panel form.

Referring to FIG. 6C, in a preferred method, a plurality of power circuit assemblies are formed on a large panel 54 that includes a plurality of substrates 20. Once the power circuit assemblies are completed while substrates 20 are in panel form, panel 54 is cut into individual substrates 20, whereby individual power circuit assemblies are obtained.

Figure 7A:
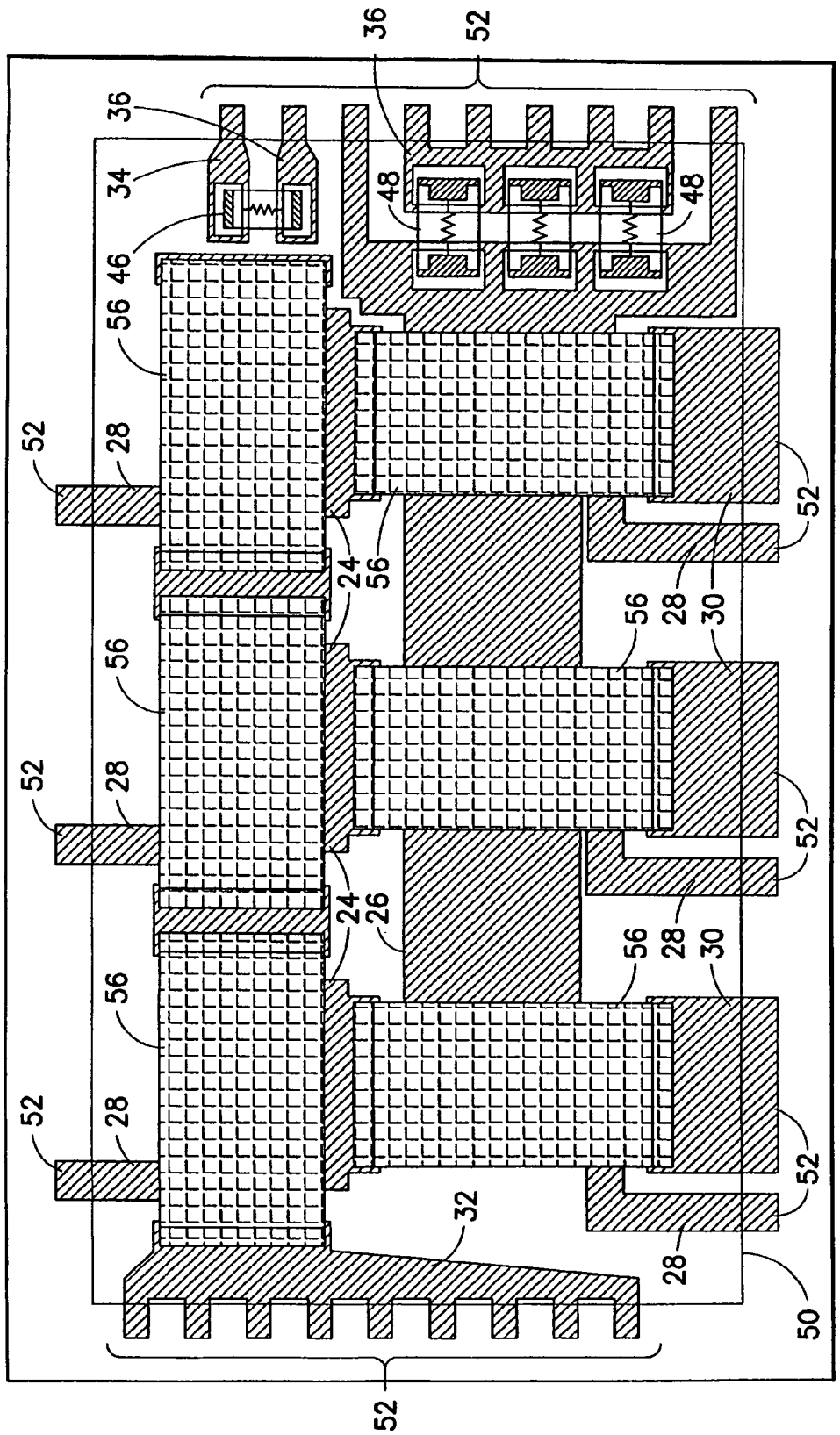
FIG. 7A shows a top plan view of a power circuit assembly according to the second embodiment of the present invention.
Figure 7B:
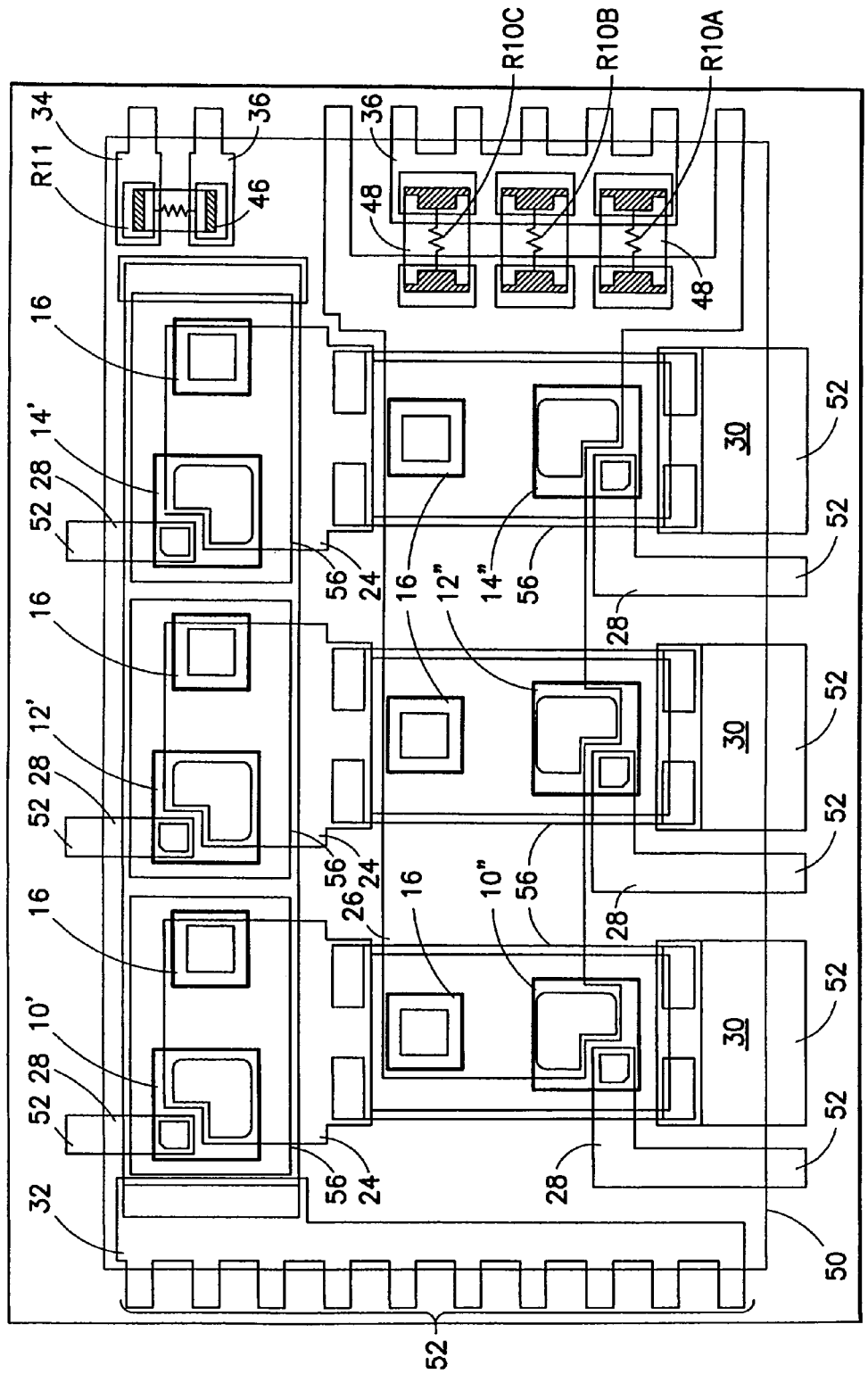
FIG. 7B shows the power circuit assembly of FIG. 7A having its clips and its power semiconductor die rendered transparent leaving only the outline thereof illustrated.
Figure 7C:
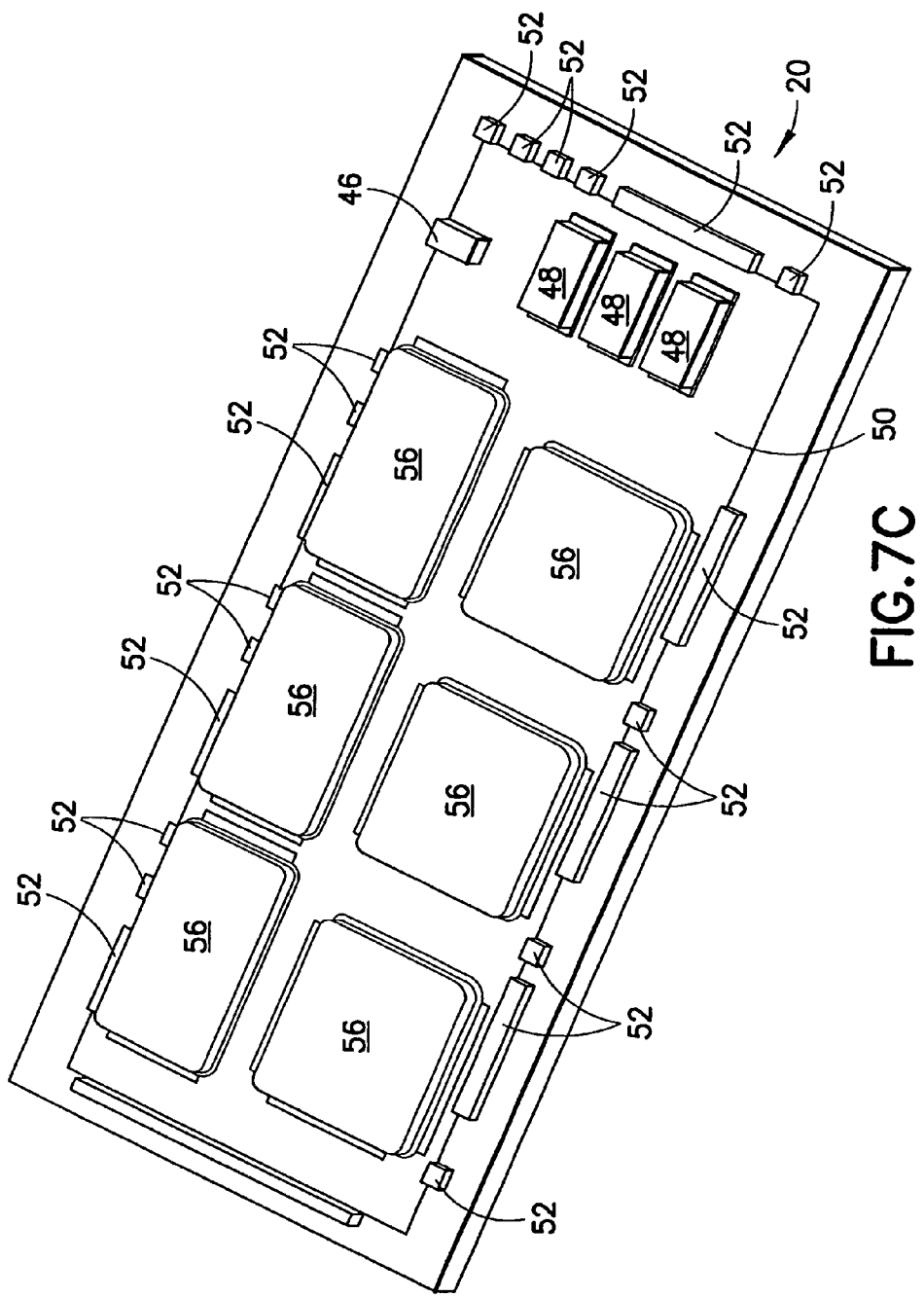
FIG. 7C is a perspective view of a power circuit assembly according to the second embodiment.

Referring next to FIG. 7A, in a power circuit assembly according to the second embodiment of the present invention, conductive clips 44 are can-shaped clips 56, and conductive clip 42 is replaced with three individual can-shaped clips 56. Each clip 56 in combination with a respective IGBT and free-wheeling diode forms a surface mountable package which can be arranged on the appropriate conductive pad. An example of a package as used in a power circuit assembly according to the second embodiment can be found in U.S. Pat. No. 6,677,669, assigned to the assignee of the present application. Similar to the first embodiment, each conductive can-shaped clip 56 that is electrically and mechanically coupled to the collector side of a low side IGBT 10", 12", 14" (FIG. 1), is also electrically and mechanically coupled to a respective conductive pad 24, thereby forming a half-bridge with a high side IGBT 10', 12', 14' coupled thereto. In FIG. 7B, clips 56 have been rendered transparent and only represented by the outline thereof to illustrate the relative position of each IGBT 10', 10", 12', 12", 14', 14" and free-wheeling diode 16. As seen in FIG. 7C, a power circuit assembly according to the second embodiment also includes passivation body 50 which exposes connector portion 52 of the conductive pads for external connection.

Figure 8A:
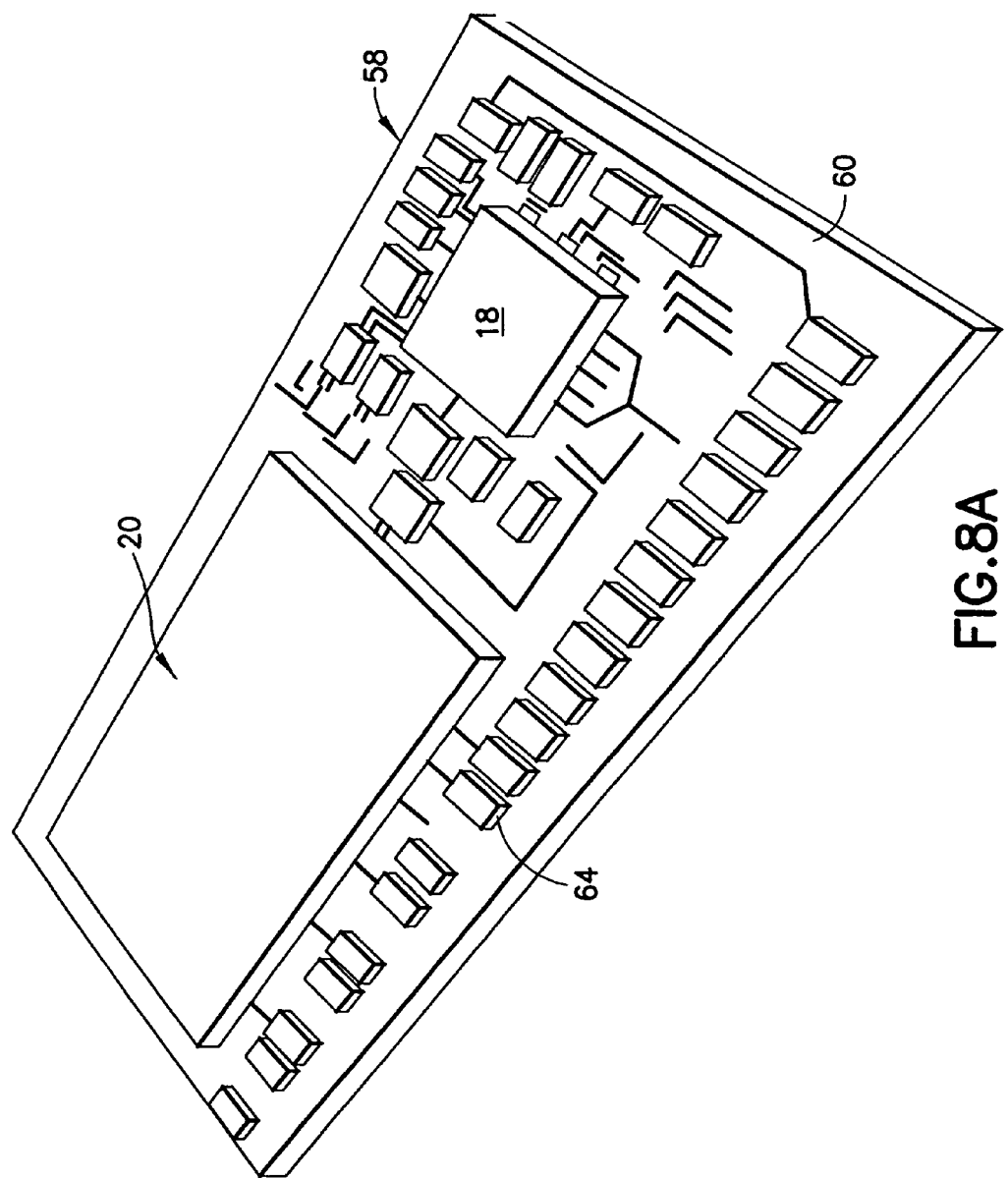
FIG. 8A shows a top plan view of a power module assembly according to the present invention.
Figure 8B:
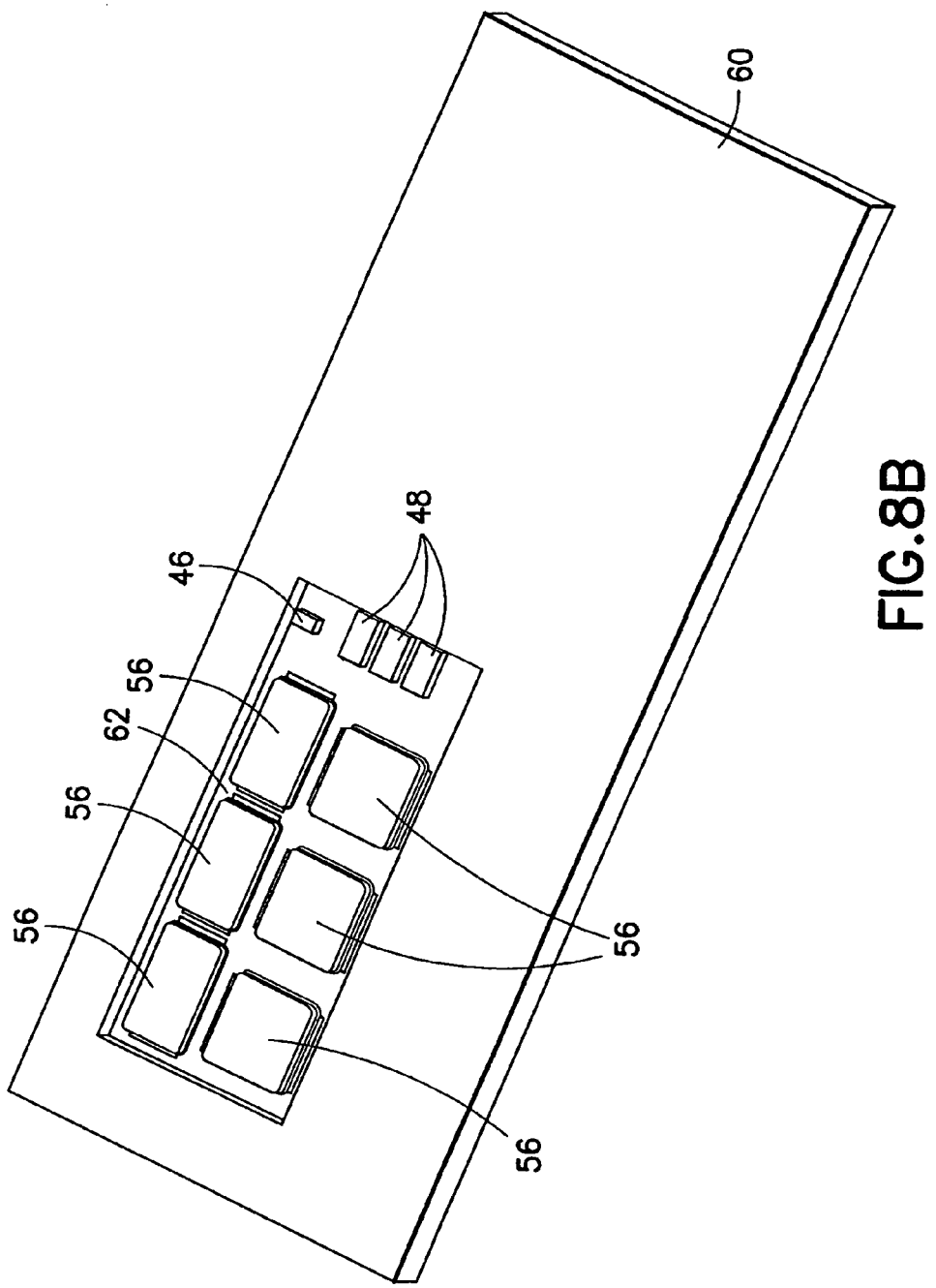
FIG. 8B shows a bottom plan view of a power module assembly according to the present invention.

Referring to FIGS. 8A and 8B, to obtain a power module according to the present invention a power circuit assembly is electrically and mechanically connected by a conductive adhesive such as solder, conductive epoxy or the like, to a drive circuit assembly 58. In one embodiment of the present invention, drive circuit assembly 58 includes a circuit board 60 which has arranged on a surface thereof driver IC 18 (FIG. 1) and other components of the drive circuitry. Circuit board 60 includes conductive lands (not shown) each of which is electrically and mechanically connected by a layer of conductive adhesive to a respective connector 52 of a power circuit assembly according to the present invention to obtain a power module. Thus, as seen in FIG. 8A, a power circuit assembly according to the present invention is flip-mounted onto drive circuit board 60. Referring specifically to FIG. 8B, drive circuit board 60 may be provided with an opening 62, whereby the tops of cans 56 are exposed. For such an arrangement, the heat generated by the power semiconductor devices can be dissipated from both sides of the power circuit assembly. Also, advantageously, the back of substrate 20 can be used as a platform for receiving a heatsink to further enhance the thermal performance of the power module.

Figure 9:
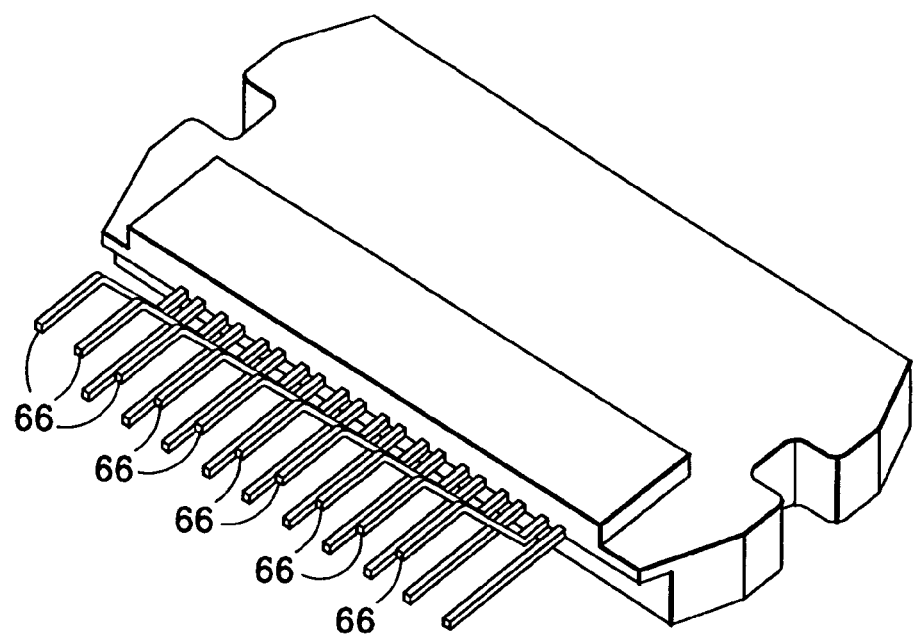
FIG. 9 shows a perspective view of a power module according to the an embodiment of the present invention.

Driver circuit assembly 58 includes a plurality of connectors 64. Connectors 64 are preferably connected to respective leads (66) and the entire module assembly is overmolded with preferably a high thermal conductivity mold compound to obtain a power module as illustrated by FIG. 9.

Figure 10:
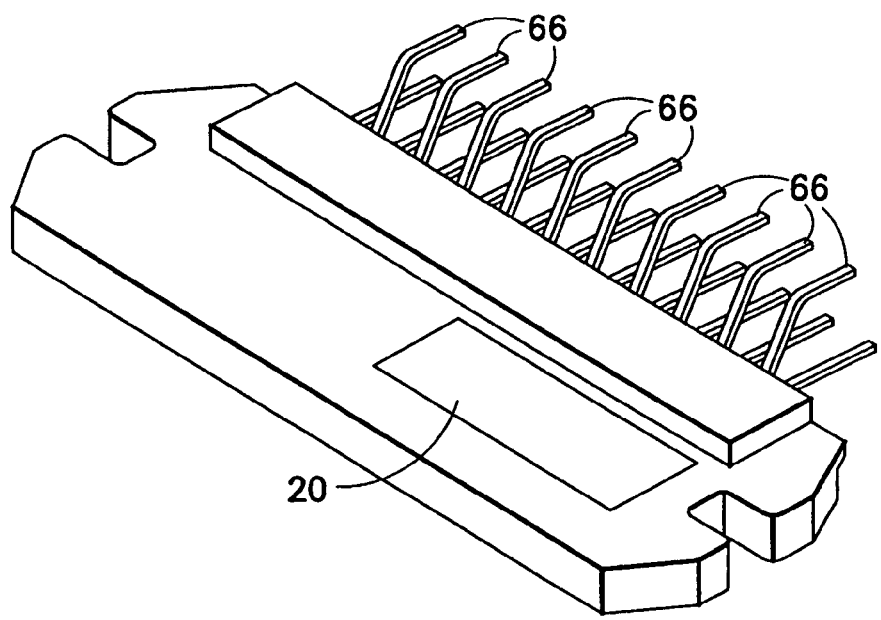
FIG. 10 shows a perspective view of an alternative embodiment of a power module according to the present invention.

Referring to FIG. 10, in an alternative embodiment, the back of substrate 20 can be exposed for improved thermal performance, or for receiving an external heatsink.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A power module comprising:
a power circuit assembly that includes,
a thermally conductive substrate having a plurality of conductive pads disposed thereon;
a plurality of power circuits, each power circuit comprising a half-bridge that includes a first power semiconductor die having a first power electrode electrically and mechanically connected to a first conductive pad on said substrate by a conductive adhesive and a second power electrode disposed opposite said first power electrode, and a second power semiconductor die having a first power electrode electrically and mechanically connected to a second conductive pad on said substrate by a conductive adhesive;
a conductive clip electrically and mechanically connected to said second power electrode of said first power semiconductor die by a conductive adhesive, said second conductive pad and a conductive pad serving as connection of the output of said half-bridge; whereby said first and second power semiconductor die in each half-bridge are electrically connected wire-free, wherein each said second power semiconductor die includes a second power electrode, said second power electrodes being electrically and mechanically connected to a common conductive clip.

2. The power module of claim 1, wherein said power circuits form a three phase half-bridge circuit.

3. The power module of claim 1, wherein first electrodes of said first power semiconductor die are electrically and mechanically coupled to a common conductive pad.

* * * * *